United States Patent [19]

Fenk et al.

[11] Patent Number: 5,115,212
[45] Date of Patent: May 19, 1992

[54] INTEGRABLE VARIABLE-FREQUENCY OSCILLATOR CIRCUIT

[75] Inventors: Josef Fenk, Eching/Ottenburg; Martin Schulz, Elsdorf-Berrendorf, both of Fed. Rep. of Germany

[73] Assignee: Siemens Aktiengesellschaft, Munich, Fed. Rep. of Germany

[21] Appl. No.: 613,156

[22] Filed: Nov. 13, 1990

[30] Foreign Application Priority Data

Nov. 10, 1989 [EP] European Pat. Off. ........ 89120906.6

[51] Int. Cl.$^5$ ............................................. H03B 5/12
[52] U.S. Cl. ............................. 331/117 R; 331/108 C; 331/177 R
[58] Field of Search .................. 331/34, 108 B, 108 C, 331/117 R, 135, 136, 137, 177 R

[56] References Cited

U.S. PATENT DOCUMENTS

| | | | |
|---|---|---|---|
| 3,815,052 | 6/1974 | Watatani et al. | 331/117 R |
| 4,595,887 | 6/1986 | Miura | 331/8 |
| 4,761,616 | 8/1988 | Ash | 331/107 A |
| 4,843,348 | 6/1989 | Fenk | 331/117 R X |

FOREIGN PATENT DOCUMENTS 2131159 12/1971 Fed. Rep. of Germany.
2649745 5/1977 Fed. Rep. of Germany.

OTHER PUBLICATIONS

Publication: Semiconductors, Motorola, Inc., 1981, "FM Modulator Circuit".

Primary Examiner—David Mis
Attorney, Agent, or Firm—Herbert L. Lerner; Laurence A. Greenberg

[57] ABSTRACT

An integrable variable-frequency oscillator circuit with a feedback amplifier configuration includes first and second input terminals. A frequency-determining feedback element is connected between the input terminals. First and second amplifier stages have inputs connected to the first input terminal and outputs supplying output signals generated by the amplifier stages. The second amplifier stage has a variable gain. A first phase-shifting component is connected to the output of the second amplifier stage for receiving the output signal of the second amplifier stage. A third amplifier stage is connected downstream of the first phase-shifting component for generating an output signal. The output of the first amplifier stage is connected downstream of the phase-shifting component for adding the output signal of the first amplifier stage to the output signal of the second amplifier stage. A second phase-shifting component is connected between the third amplifier stage and the second input terminal for supplying the output signal of the third amplifier stage to the second input terminal.

9 Claims, 3 Drawing Sheets

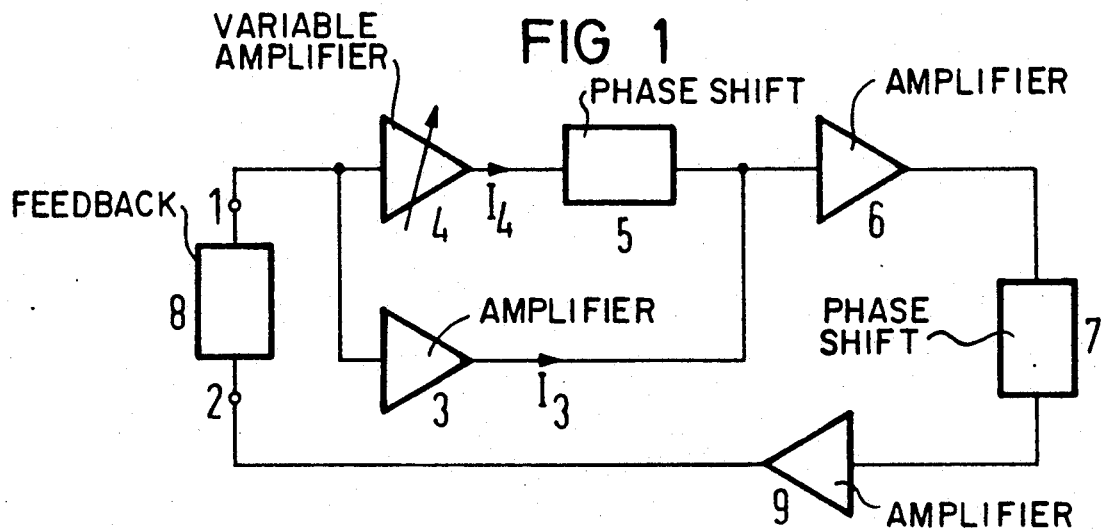
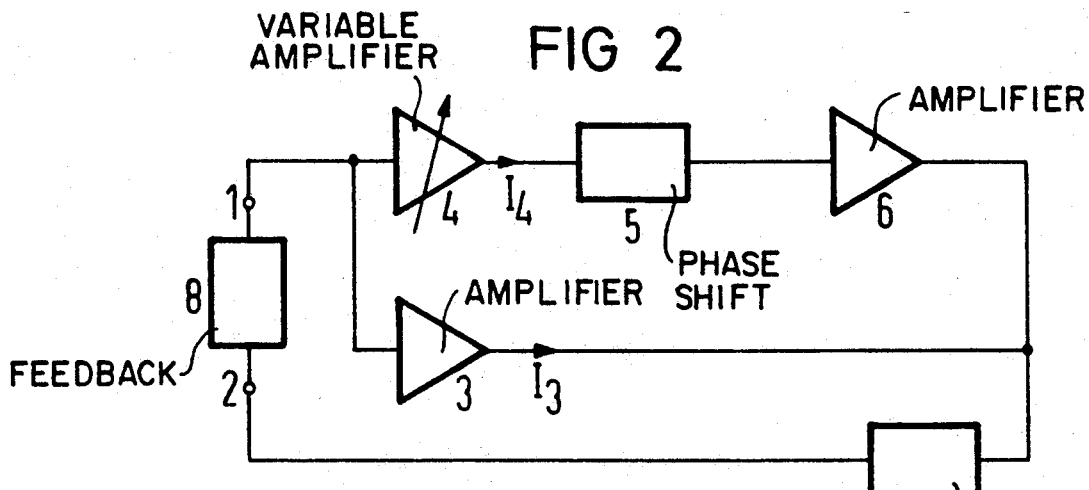
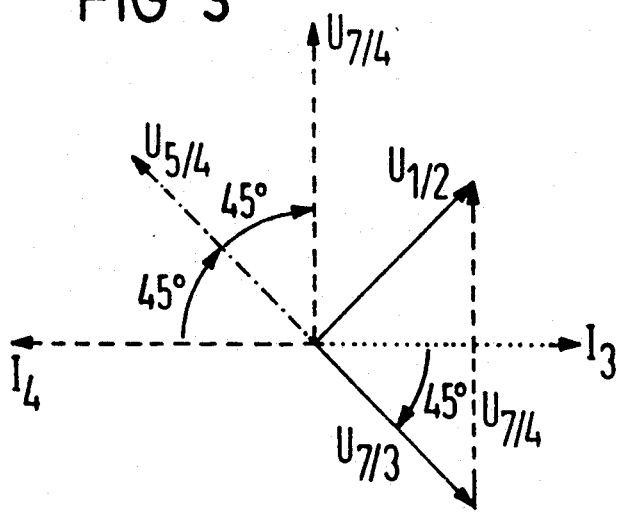

INTEGRABLE VARIABLE-FREQUENCY OSCILLATOR CIRCUIT

The invention relates to an integrable variable-frequency oscillator circuit having a feedback amplifier configuration made up of amplifier stages and phase shifter components, with two input terminals between which a frequency-determining feedback element is connected.

Such an oscillator circuit is known, for instance, from the Motorola Semiconductors data sheet on the MC 1376 component. The oscillator described therein includes a differential amplifier having an input connected to the first terminal of a frequency-determining feedback element, and a variable-gain amplifier stage connected in the first output branch. A low-pass filter is connected in the second output branch of the differential amplifier. The sum of the two output signals is carried through a further amplifier stage to the second terminal of the frequency-determining feedback element. Through the use of the variable gain in the first output branch of the differential amplifier, the phase of the summation signal of the two output branches, and correspondingly the oscillation frequency of the oscillator circuit, can be varied by a maximum of +45° relative to the input signal of the differential amplifier. The disadvantages of that circuit configuration are that the controllable amplifier is located in the oscillating circuit, permitting feedback of the oscillation frequency to the control variable and limiting the phase angle rotation range to from 0° to 45°.

It is accordingly an object of the invention to provide an integrable variable-frequency oscillator circuit, which overcomes the hereinafore-mentioned disadvantages of the heretofore-known devices of this general type and to do so in such a way that the oscillation frequency can be varied over a wide range, and feedback to the control variable is only slight.

With the foregoing and other objects in view there is provided, in accordance with the invention, an integrable variable-frequency oscillator circuit with a feedback amplifier configuration, comprising first and second input terminals; a frequency-determining feedback element connected between the input terminals; first and second amplifier stages having inputs and outputs, one input of each amplifier stage being connected to the first input terminal and the outputs supplying output signals generated by the amplifier stages; the second amplifier stage having a variable gain; a first phase-shifting component connected to the output of the second amplifier stage for receiving the output signal of the second amplifier stage; a third amplifier stage connected downstream of the first phase-shifting component for generating an output signal; the output of the first amplifier stage being connected downstream of the phase-shifting component for adding the output signal of the first amplifier stage to the output signal of the second amplifier stage; and a second phase-shifting component connected between the third amplifier stage and the second input terminal for supplying the output signal of the third amplifier stage to the second input terminal.

In accordance with another feature of the invention, the third amplifier stage has an input, and the output of the first amplifier stage is connected to the input of the third amplifier stage.

In accordance with a further feature of the invention, the third amplifier stage has an output, and the output of the first amplifier stage is connected between the output of the third amplifier stage and the second phase-shifting component for adding the output signal of the first amplifier stage to the output signal of the third amplifier stage.

In accordance with an added feature of the invention, the third amplifier stage has an output, and there is provided a fourth amplifier stage having an output connected to the second input terminal and an input connected to the output of the third amplifier stage for receiving the output signal of the third amplifier stage.

In accordance with an additional feature of the invention, the first phase-shifting component shifts the phase of the output signal of the second amplifier stage by +225°.

In accordance with yet another feature of the invention, the input of the second amplifier stage receives a signal being inverted by the second amplifier stage, and the first phaseshifting component shifts the phase of the output signal of the second amplifier stage by +45°.

In accordance with yet a further feature of the invention, the second phase-shifting component effects a phase shift of +45°.

In accordance with a concomitant feature of the invention, the first and/or second phase-shifting component is a low-pass filter.

Other features which are considered as characteristic for the invention are set forth in the appended claims.

Although the invention is illustrated and described herein as embodied in an integrable variable-frequency oscillator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a schematic circuit diagram of a first basic circuit configuration according to the invention;

FIG. 2 is a circuit diagram of a second basic circuit configuration according to the invention;

FIG. 3 is a vector diagram which shows the phase relationship among various currents and voltages of the basic circuit configurations;

Figure 4:
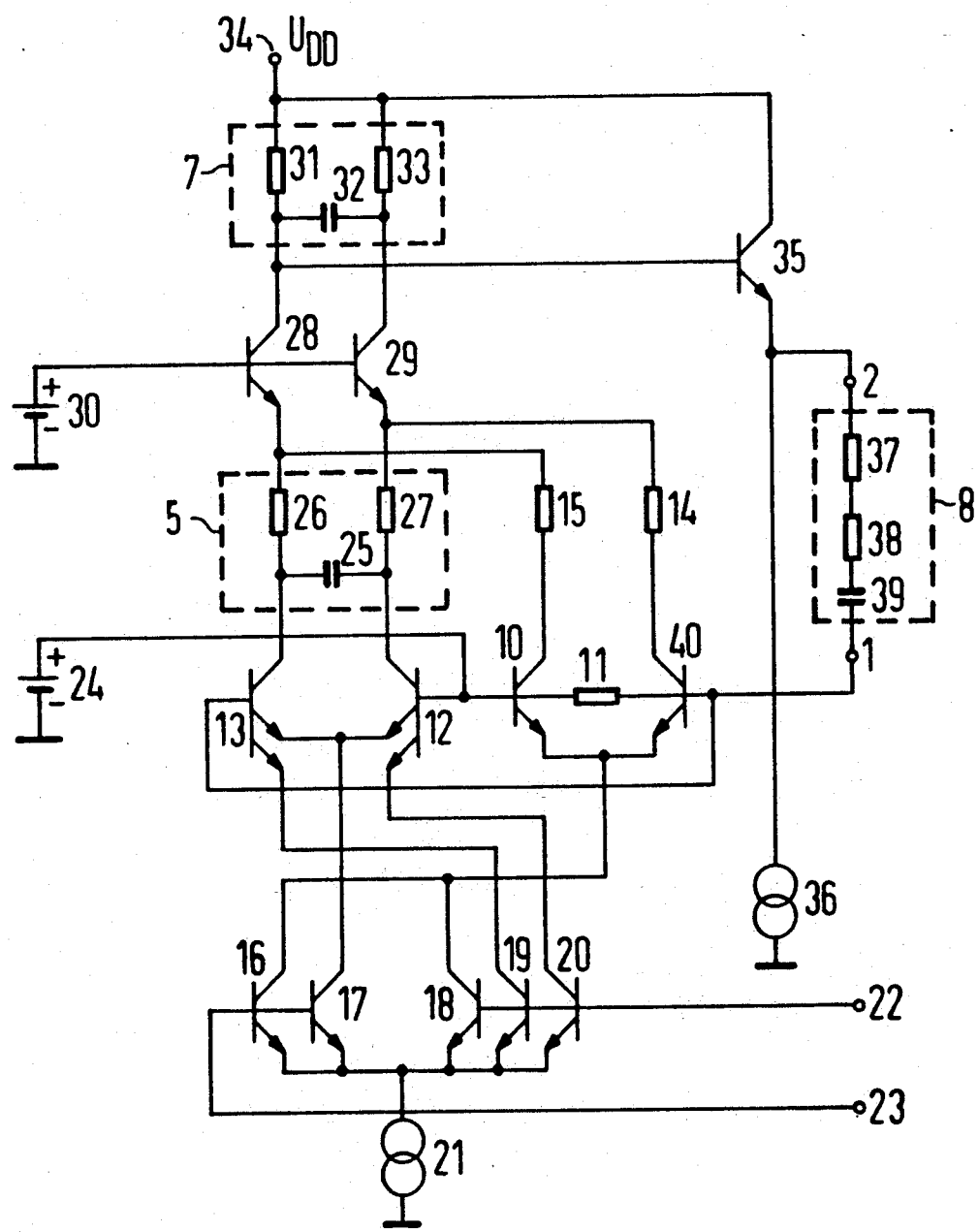
FIG. 4 is a circuit diagram of a first exemplary embodiment having a serial oscillating circuit in accordance with the basic circuit configuration of FIG. 1.

Referring now to the figures of the drawing in detail and first, particularly, to FIG. 1 thereof, there is seen a configuration which has first and second input connecting terminals 1, 2, between which a frequency-determining feedback or regenerative element 8, such as an oscillating circuit or a quartz or ceramic oscillator, is connected. The first input terminal 1 is connected to one input of each of first and second amplifier stages 3, 4. The gain of the second amplifier stage 4 is variable. The output of the second amplifier stage 4 is connected through a first phase-shifting component 5 to the input of a third amplifier stage 6. The output of the first amplifier stage 3 is also connected to the input of the third amplifier stage 6. The output of the third amplifier stage 6 is connected through a second or further phase-shifting component 7 to the input of a fourth amplifier stage 9. The output of the fourth amplifier stage 9 is connected to the second input terminal 2.

The mode of operation will be described in further detail below in conjunction with FIG. 3, which is a vector diagram that illustrates the phase relationship of voltages and currents to be described below, in the basic circuit configuration of FIG. 1. In order to obtain the widest possible oscillation frequency range while simultaneously keeping the circuitry expense low, it is advantageous for the first phase-shifting component 5 to effect a phase shift of +225°, and for the second phase-shifting component 7 to effect a phase shift of +45°, at the resonant frequency determined by the feedback element 8. The selection of these phase shifts assures an optimal oscillation frequency range at a constant output amplitude. This can be attained, for instance, by constructing the phase-shifting components 5, 7 by means of first order low-pass filters, and by having the current-controlled amplifier stage 4 generate an output signal that is inverted with respect to the amplifier stage 3. This particular option will therefore be assumed for the functional description that follows.

If the gain of the amplifier stage 4 is equal to 0, then the feedback amplifier branch, including the amplifier stage 4 and the following phase-shifting component 5, is switched off. The oscillator circuit then behaves like a normal feedback amplifier configuration. Through the use of the phase-shifting component 5, a voltage $U_{7/3}$ is phase-shifted by +45° at the phase shifting component 7, relative to a current $I_3$ generated by the amplifier stage 3. The oscillation condition for a feedback amplifier configuration requires that the phase of the feedback signal be equal to zero or an integral multiple of $\pi$. This oscillation condition is met only if a suitable oscillation frequency is established.

If the branch of the amplifier formed by the amplifier stage 4 and the phase-shifting component 5 is then set at a gain that is greater than 0, then the following state is established: The amplifier stage 4 inverts the input signal, and thus an output current $I_4$ that is phase-shifted by +180° relative to the current $I_3$ flows at its output. A voltage $U_{5/4}$ at the phase-shifting component 5 is phase-shifted by a further +45° relative to the current $I_4$. Through the use of the amplifier stage 6 and the phase-shifting component 7, a voltage $U_{7/4}$ at the phase-shifting component 7 shifts by a further +45°, or in other words a total of 90°, relative to the current $I_4$.

The addition of the two voltages $U_{7/3}$ and $U_{7/4}$ results in a voltage $U_1$ that can be picked up at the connecting terminals 1, 2. The phase of the voltage $U_1$ and thus the corresponding frequency of the oscillator circuit can then vary between −45° and +45° relative to the current $I_3$, in accordance with the set gain of the amplifier stage 4. Advantageously, the signal present at the output of the phase-shifting component 7 can be decoupled through the further amplifier stage 9. However, with suitable dimensioning of the remainder of the circuit configuration, the amplifier stage 9 may be omitted.

Another advantage of this circuit configuration is that the oscillating circuit voltage, which is reduced by 3dB at the corner frequencies, in other words with −45° and +45° phase displacement, is compensated for by the voltage of the active circuit component, which is 3 dB higher at the corner, cutoff or limit frequencies.

FIG. 2 shows a second basic circuit configuration according to the invention. The circuit configuration is largely equivalent to that shown in FIG. 1, except that the output of the first amplifier stage 3 is not connected to the input of the third amplifier stage 6. Instead, the output signal of the first amplifier stage 3 is supplied between the output of the third amplifier stage 6 and the phase-shifting component 7 and added to the output signal of the third amplifier stage 6. Otherwise, the mode of operation of the basic circuit configuration shown in FIG. 2 is equivalent to that described for FIG. 1.

FIG. 4 shows a first exemplary embodiment having a serial oscillating circuit in accordance with the basic circuit configuration of FIG. 1.

The serial oscillating circuit 8 that is connected between the two input terminals 1, 2 includes a resistor 37, an inductive resistor 38 and a capacitor 39. The first amplifier stage 3 is provided as a differential amplifier which includes transistors 40, 10, a current source 21 and transistors 16, 18. The base of the first transistor 40 is connected to the first connecting terminal 1. A reference voltage 24 is present at the base of the second transistor 10. A resistor 11 is connected between the bases of the transistor 40 and the transistor 10. The emitters of the transistors 40, 10 are connected to one another and are connected through the load paths of the two parallel-connected transistors 16, 18 to a first terminal of the current source 21. A second terminal of the current source 21 is connected to a fixed potential, such as ground. The base of the transistor 18 is connected to a first input terminal 22, and the base of the transistor 16 is connected to a second input terminal 23.

The second current-controlled amplifier stage 4 is likewise formed of a further differential amplifier. This amplifier includes two multiple emitter transistors 12, 13, the current source 21 and three control transistors 17, 19, 20. The inputs of the second differential amplifier are connected parallel to the inputs of the first differential amplifier in such a manner that the base of the multiple emitter transistor 12 is connected to the base of the transistor 10, and the base of the multiple emitter transistor 13 is connected to the base of the transistor 40. First emitters of the multiple emitter transistors 12 and 13 are connected to the collector of the transistor 17. A second emitter of the multiple emitter transistor 12 is connected to the collector of the transistor 20, and the second emitter of the multiple emitter transistor 13 is connected to the collector of the transistor 19. The emitters of the transistors 17, 19 and 20 are connected to the first terminal of the current source 21. The base of the transistor 17 is connected to the base of the transistor 16, and the bases of the transistors 19, 20 are connected to the base of the transistor 18.

The phase-shifting component 5 is formed of a symmetrically constructed low-pass filter, which includes two resistors 26, 27 and one capacitor 25. The capacitor 25 is connected between the collectors of the multiple emitter transistors 12, 13. A first terminal of the resistor 26 is connected to the collector of the multiple emitter transistor 13, and a first terminal of the resistor 27 is connected to the collector of the multiple emitter transistor 12. A second terminal of the resistor 26 is connected to the collector of the transistor 10 through a further resistor 15. A second terminal of the resistor 27 is connected to the collector of the transistor 40 through a further resistor 14. Each of the second terminals of the resistors 26, 27 are also connected to the emitter of a respective one of two transistors 28, 29. These transistors 28, 29 form the third amplifier stage 6. The base of the transistor 29 is connected to the base of the transistor 28, at which a reference voltage 30 is present.

The further phase-shifting component 7 is constructed in the same way as the phase-shifting component 5 and includes two resistors 31, 33 and a capacitor 32. First terminals of the resistors 31, 33 are each connected to the collector of a respective one of the transistors 28, 29, between which the capacitor 32 is connected. Second terminals of the resistors 31, 33 are connected to a third input terminal 34, to which a supply voltage $U_{DD}$ can be applied.

The fourth amplifier stage 9 is formed by a transistor 35 and a current source 36. The collector of the transistor 28 is connected to the base of the further transistor 35. The emitter of the transistor 35 is connected both to the connecting terminal 2 and to a first terminal of the current source 36. A second terminal of the current source is connected to a fixed potential, such as ground. The collector of the transistor 35 is connected to the third input terminal 34.

The control voltage for the amplifier stage 4 is applied to the input terminals 22, 23. By splitting the current of the current source 21 by means of the transistors 16–20 and ensuing summation, the control current for the first differential amplifier, which is formed of the transistors 40, 10, and the collector voltages of the transistors 12, 13, 28, 29, remain constant. In this way the operating points of the transistors 12, 13, 28, 29 at various control voltages at the transistors 17, 19, 20 are not shifted. Due to the inverse wiring of the inputs of the second differential amplifier 12, 13, the output signal of the second differential amplifier is shifted by 180° relative to the output signal of the first differential amplifier. The transistor 35 and the current source 36 form the fourth or further amplifier stage, which decouples the signal applied to the second or further phaseshifting component 7. The remaining function is equivalent to that described for FIG. 1. Constructing the basic circuit configuration of FIG. 1 symmetrically has the advantage of compensating for interference caused by the push-pull suppression of the various amplifier stages.

Figure 5:
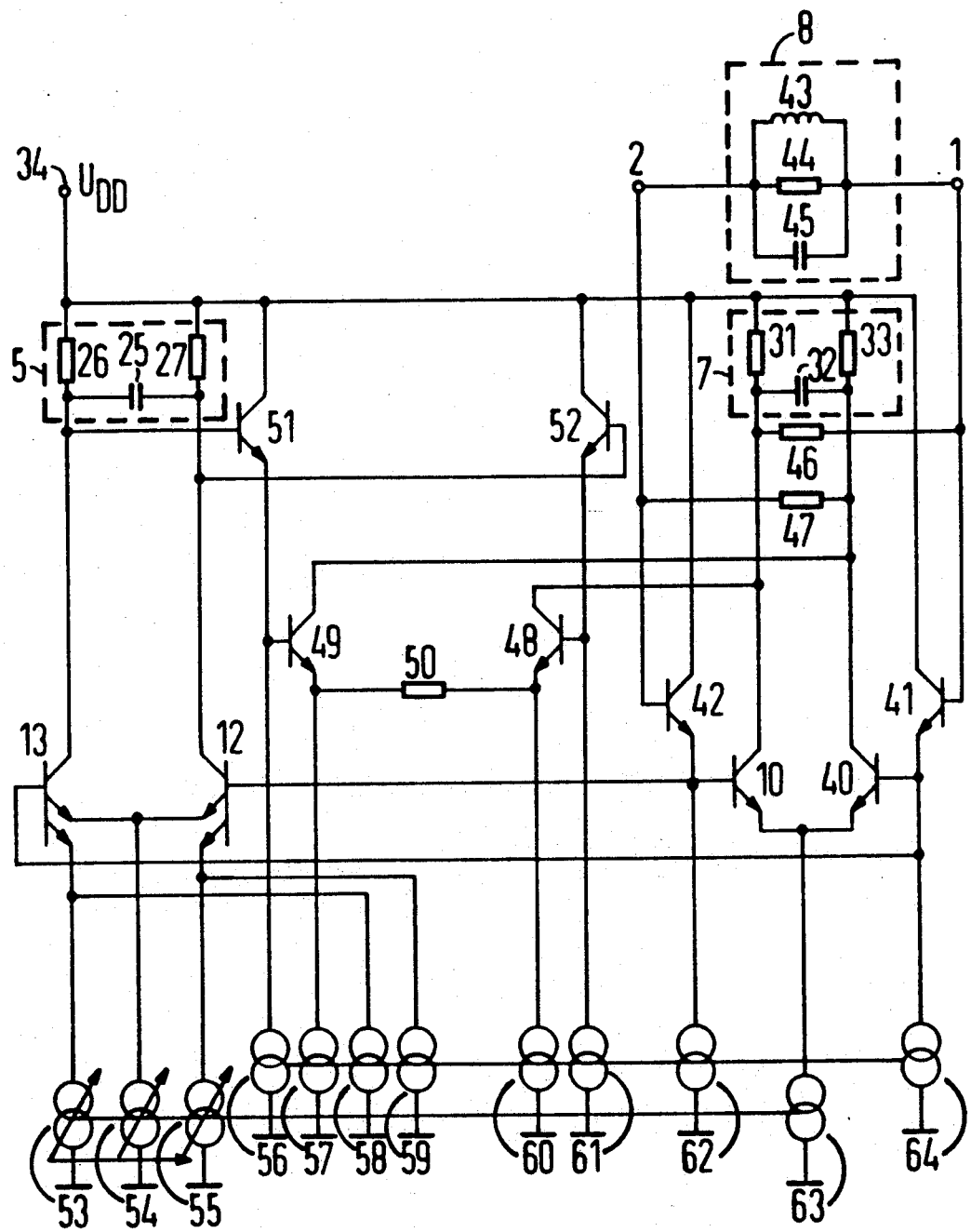
FIG. 5 is a circuit diagram of a second exemplary embodiment with a parallel oscillating circuit in accordance with the basic circuit configuration of FIG. 2.

FIG. 5 shows a second exemplary embodiment having a parallel oscillating circuit in accordance with the basic circuit configuration of FIG. 2. The parallel oscillating circuit 8, which is again connected between the two input terminals 1, 2, includes an inductive resistor 43, a resistor 44 and a capacitor 45. The first amplifier stage 3 is again formed of a differential amplifier, which includes transistors 10, 40, 41, 42 and current sources 62, 63, 64. The first input terminal 1 is connected to the base of the transistor 41, and the second input terminal 2 is connected to the base of the transistor 42. The collectors of both transistors 41, 42 are connected to the further connecting or input terminal 34, to which a supply voltage $U_{DD}$ can be applied. The emitter of the transistor 41 is connected to both a first terminal of the current source 64 and the base of the transistor 40. The emitter of the transistor 42 is connected to both a first terminal of the current source 62 and the base of the transistor 10. The emitters of the transistors 10, 40 are connected to a first terminal of the current source 63. Second terminals of each of the current sources 62, 63, 64 are connected to a fixed potential, such as ground. The collector of the transistor 10 is connected to the first input terminal 1 through a resistor 46, and the collector of the transistor 40 is connected to the second input terminal 2 through a resistor 47.

The second current-controlled amplifier stage 4 is constructed in the same way as in FIG. 4, as a differential amplifier including two multiple emitter transistors 12, 13. The base of the multiple emitter transistor 12 is connected to the base of the transistor 10, and the base of the multiple emitter transistor 13 is connected to the base of the transistor 40. The first emitters of the multiple emitter transistors 12, 13 are connected to a first terminal of a variable current source 54. The second emitters of the multiple emitter transistors are each connected to a first terminal of a respective one of two variable current sources 53, 55. One current source 58, 59 is connected parallel to each respective variable current source 53, 55. Second terminals of the variable current sources 53, 54, 55 and of the current sources 58, 59 are connected to a fixed potential, such as ground.

The structure of the phase-shifting component 5 is the same as in FIG. 4. The first terminals of the resistors 26, 27 are each connected to the collector of a respective one of the multiple emitter transistors 12, 13. The second terminals of the resistors are connected to the input terminal 34.

The third amplifier stage 6 is likewise formed of a differential amplifier, which includes transistors 48, 49, 51, 52, a resistor 50 and current sources 56, 57, 60, 61. The collectors of the transistors 51, 52 are connected to the input terminal 34. The base of the transistor 51 is connected to the collector of the transistor 13 and the base of the transistor 52 is connected to the collector of the transistor 12. The emitter of the transistor 51 is connected both to the base of the transistor 49 and to a first terminal of the current source 56. The emitter of the transistor 52 is connected both to the base of the transistor 48 and to a first terminal of the current source 61. The resistor 50 is connected between the emitters of the transistor 48, 49. The emitter of the transistor 48 is connected to a first terminal of the current source 60, and the emitter of the transistor 49 is connected to the first terminal of the current source 57. Second terminals of the current sources 56, 57, 60, 61 are again connected to a fixed potential, such as ground. The collector of the transistor 48 is connected to the collector of the transistor 10 and the collector of the transistor 49 is connected to the collector of the transistor 40.

The phase-shifting component 7 is constructed in the same way as in FIG. 4. The first terminals of the resistors 31, 33 are each connected to the collector of a respective one of the transistors 10, 40. The second terminals of the resistors 31, 33 are connected to the input terminal 34. The variable current sources 53, 54, 55 and the current source 63 are assigned to a first current bank, and the current sources 56 . . . 62, 64 are assigned to a second current bank.

Splitting of the current of the variable current sources 53, 54, 55 can again be effected by a differential stage, as shown in FIG. 4. The ensuing summation in the multiple emitter transistors 12, 13 assures that the collector voltages of these transistors remain constant. The symmetrical construction again assures that there will only be slight crosstalk and that there will be compensation for other external influences. The mode of operation is equivalent to that described in conjunction with FIG. 1 or 2.

The advantage of the circuit configuration shown in FIG. 5 over that shown in FIG. 4 is that even at a low supply voltage $U_{DD}$ at the input terminal 34, an adequate collector-to-emitter voltage of the transistors of the various amplifier stages 3, 4, 6 is assured. This may not be the case at a low supply voltage in the circuit configuration shown in FIG. 4, as a result of the voltage drops occurring at the transistors of the amplifiers stages 3, 4, 6, 9.

The npn transistors used in FIGS. 4 and 5 may be replaced with either pnp transistors, p-channel or n-channel field effect transistors.

We claim:

1. Integrable variable-frequency oscillator circuit with a feedback amplifier configuration, comprising:
   a) first and second input terminals;
   b) a frequency-determining feedback element connected between said input terminals;
   c) first and second amplifier stages having inputs connected to said first input terminal and outputs supplying output signals generated by said amplifier stages;
   d) said second amplifier stage having a variable gain;
   e) a first phase-shifting component connected to said output of said second amplifier stage for receiving the output signal of said second amplifier stage;
   f) a third amplifier stage connected downstream of said first phase-shifting component for generating an output signal;
   f) said output of said first amplifier stage being connected downstream of said phase-shifting component for adding the output signal of said first amplifier stage to the output signal of said second amplifier stage; and
   g) a second phase-shifting component connected between said third amplifier stage and said second input terminal for supplying the output signal of said third amplifier stage to said second input terminal.

2. Integrable variable-frequency oscillator circuit according to claim 1, wherein said third amplifier stage has an input, and said output of said first amplifier stage is connected to said input of said third amplifier stage.

3. Integrable variable-frequency oscillator circuit according to claim 1, wherein said third amplifier stage has an output, and said output of said first amplifier stage is connected between said output of said third amplifier stage and said second phase-shifting component for adding the output signal of said first amplifier stage to the output signal of said third amplifier stage.

4. Integrable variable-frequency oscillator circuit according to claim 1, wherein said third amplifier stage has an output, and including a fourth amplifier stage having an output connected to said second input terminal and an input connected to said output of said third amplifier stage for receiving the output signal of said third amplifier stage.

5. Integrable variable-frequency oscillator circuit according to claim 1, wherein said first phase-shifting component shifts the phase of the output signal of said second amplifier stage by $+225°$.

6. Integrable variable-frequency oscillator circuit according to claim 1, wherein said input of said second amplifier stage receives a signal being inverted by said second amplifier stage, and said first phase-shifting component shifts the phase of the output signal of said second amplifier stage by $+45°$.

7. Integrable variable-frequency oscillator circuit according to claim 1, wherein said second phase-shifting component effects a phase shift of $+45°$.

8. Integrable variable-frequency oscillator circuit of claim 6, wherein said first phase-shifting component is a low-pass filter.

9. Integrable variable-frequency oscillator circuit of claim 7, wherein said second phase-shifting component is a low-pass filter.

* * * * *